United States Patent [19]

Wischermann

[11] Patent Number: 5,195,044
[45] Date of Patent: Mar. 16, 1993

[54] DIGITAL OSCILLATOR FOR GENERATING A SIGNAL OF CONTROLLABLE FREQUENCY

[75] Inventor: Gerhard Wischermann, Weiterstadt, Fed. Rep. of Germany

[73] Assignee: BTS Broadcast Television Systems GmbH, Darmstadt, Fed. Rep. of Germany

[21] Appl. No.: 639,965

[22] Filed: Jan. 11, 1991

[30] Foreign Application Priority Data

Jan. 20, 1990 [DE] Fed. Rep. of Germany ....... 4001555

[51] Int. Cl.$^5$ .............................................. G06F 15/20
[52] U.S. Cl. ..................................... 364/480; 377/52
[58] Field of Search ........................ 328/63; 331/1 A; 364/480; 377/48, 49, 52

[56] References Cited

U.S. PATENT DOCUMENTS 3,624,517 11/1971 Kobayashi et al. ............... 328/63 X
4,694,475 9/1987 Mehrgardt ..................... 331/1 A X Primary Examiner—Edward R. Cosimano
Attorney, Agent, or Firm—Frishauf, Holtz, Goodman & Woodward

[57] ABSTRACT

A digital oscillator is built around an accumulator which is incremented by a predetermined number N of unit values at every pulse of a sequence of pulses of a reference frequency and the carry output of the accumulator is used to produce the output frequency. In order to eliminate the jitter of that output, the carry signal is supplied to a delay chain, from the output of which a delay is selected in a manner dependent upon the content of the accumulator during the presence of the carry signal in question at the output of the accumulator. The carry pulse times a D register in which the contemporary content of the accumulator is stored until the next carry pulse while being supplied to a calculation circuit for selecting the appropriate delay derived from the D register content and the number of units of accumulator incrementation in use at the particular time. It is possible to use a simple limiter for the calculation where the range of the increment magnitude is small and it is possible to extend the range of output frequency to harmonics by providing an AND correlation of the reference pulses and the carry pulse ahead of the input to the delay chain.

10 Claims, 2 Drawing Sheets

DIGITAL OSCILLATOR FOR GENERATING A SIGNAL OF CONTROLLABLE FREQUENCY

This invention concerns a digital oscillator in which pulses of a reference clock frequency are supplied to an accumulator which is incremented after every pulse of the reference frequency by a predetermined number of count units and which provides an overflow signal when a predetermined content is reached.

In communication technology oscillators are frequently required to be controllable in frequency by means of signals supplied to them. Such oscillators are usually put into frequency or phase regulation loops.

Along with other controllable oscillators, such as for example LC and RC oscillators, digital oscillators have become known. These contain an accumulator of which the content is raised by a certain increment by every pulse of a reference frequency. At the carry or overflow output of the accumulator a signal appears at intervals which has a frequency that is a fraction of the reference frequency. The capacity of the accumulator and the prescribed increment N can be chosen to set the particular fractional frequency relation. The accumulator content can also be evaluated or monitored.

Digital oscillators, compared with LC and RC oscillators have the advantage of a high constancy of frequency since in general the reference frequency is generated with a quartz-controlled oscillator. Compared with directly quartz-controlled oscillators, there is the advantage of a greater range of variation. The known digital oscillators have the disadvantage, however, that the carry signal is produced with jitter (timing fluctuations). Furthermore the known circuits are limited with reference to the ratio of the frequency of the generated signal to the reference frequency.

SUMMARY OF THE INVENTION.

It is an object of the present invention to provide a digital oscillator for generating signals of controllable frequency in which there is the least possible jitter.

Briefly, the carry signal is made delayable by an interval that is dependent upon the accumulator content immediately following the event.

The digital oscillator of the invention has the advantage that jitter can be prevented at low cost. This digital oscillator, moreover, makes possible simple provisions for extending the frequency range of the generated signal.

The signals generated by the digital oscillator of the invention are utilized mostly as clock signals for other digital circuits, for example in video technology. In view of the existence of other fields of application and for distinguishing the signals generated by the digital oscillator of the invention from the reference frequency pulses, the signals generated by the oscillator of the invention are hereinafter referred to simply as signals.

The carry signal is supplied to a controllable delay device, preferably a delay chain with multiple outputs corresponding to various delays and respectively connected to different inputs of a selection multiplexer having a control input which is dependent upon the state of the accumulator during the carry signal in question and on the size of the increment which is periodically supplied to the accumulator.

It is convenient for the carry signal to clock a D register into which the contemporary content of the accumulator is loaded at the appearance of every carry signal and made available to a circuit for generating the control signal for the selectable delay, to which there is also connected the same signal which supplies the increments to the accumulator.

When the range of selectable increment magnitudes is limited, the calculating circuit can be simply a limiter to provide an adequately approximate control signal. In other words, the calculating circuit may be broadly defined as an arithmetic processing circuit. The frequency range of the digital oscillator can be extended to higher frequencies by providing an AND gate at the input to the delay chain to which both the carry signal and the reference frequency pulses are supplied as inputs and in this case it may be useful to provide a bandpass filter at the output of the oscillator to which the selectably delayed oscillator pulses are supplied.

BRIEF DESCRIPTION OF THE DRAWINGS.

The invention will now be described in more detail by way of illustrative examples with reference to the annexed drawings, in which.

When the same parts are shown in two or more figures of the drawings, they are designated with the same reference numeral.

DESCRIPTION OF THE ILLUSTRATED EMBODIMENTS.

Figure 1:
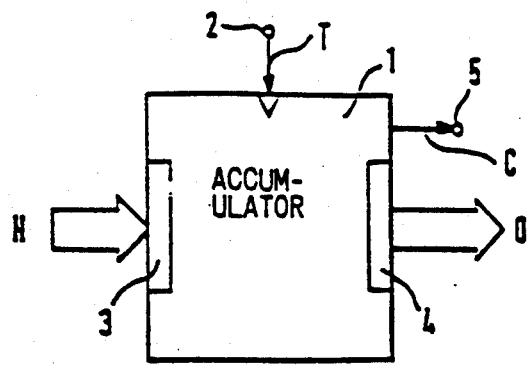
FIG. 1 is a circuit block diagram of a known digital oscillator.

FIG. 1 illustrates a heretofore known digital oscillator. It contains an accumulator 1 having a clock or timing input 2 to which reference pulses T having the frequency $f_R$ are supplied. A magnitude signal N is supplied to the input 3. The content of the accumulator 1 is incremented by the magnitude N at each reference frequency pulse T. A signal O corresponding to the accumulator content can be obtained from an output 4. Furthermore, another output 5 supplies a signal C—referred to as the carry signal—which goes to the binary logic level H whenever an overflow is present in the accumulator.

Figure 2A:
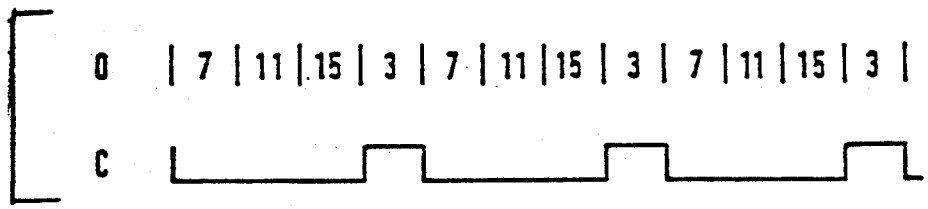
FIGS. 2a, 2b and 2c together provide a timing diagram for explaining errors that occur in the digital oscillator of FIG. 1, FIG. 2a showing operation of the prior art oscillator of FIG. 1 for the increment N=4, FIG. 2b the same for N=6 and FIG. 2c showing some detail of the generation of pulses in the circuit of FIG. 1 for N=7, and thereby explaining the basis of the invention.

The operation of the circuit of FIG. 1 is explained with reference to the timing diagram of FIG. 2a. It is to be assumed that the accumulator has four bit places, so that it can take any of sixteen states designated 0 to 15. It is also assumed that N=4. The first line of FIG. 2a shows the content of the accumulator between every two pulses of the reference pulse sequence T and the second line of FIG. 2a shows the corresponding level of the carry signal C. In the illustrated time sequence the accumulator content first goes from 7 to 11 and at the next pulse is incremented to 15. These values are obtainable at the accumulator content output O. In the succeeding incrementation the accumulator content becomes 3, at which time there is an overflow since a new cycle has begun and the carry signal C takes the level H during the following interpulse interval of the reference pulses T. Because of the whole number ratio between the capacity of the accumulator 1 and the count increment N, what results as an output signal C is a pulse sequence with uniform interpulse intervals.

Figure 2B:
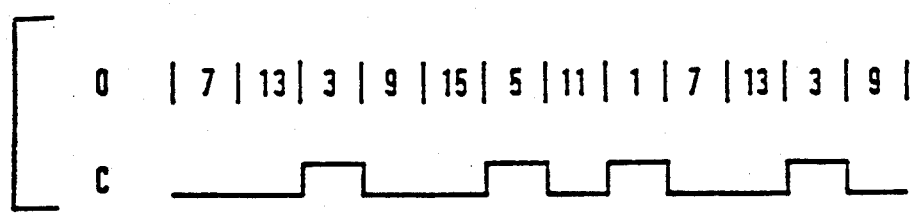

If a different increment is selected in order to generate a different output frequency, the carry signal may have non-uniform intervals between its intervals of level H, so that, as shown in FIG. 2b for N=6 the signal C will also be non-uniform. In this case N=6 and the count sequence is 7, 13, 3, 9, 15, 1, in which pulses are produced at 3, 5 and 1.

Figure 2C:
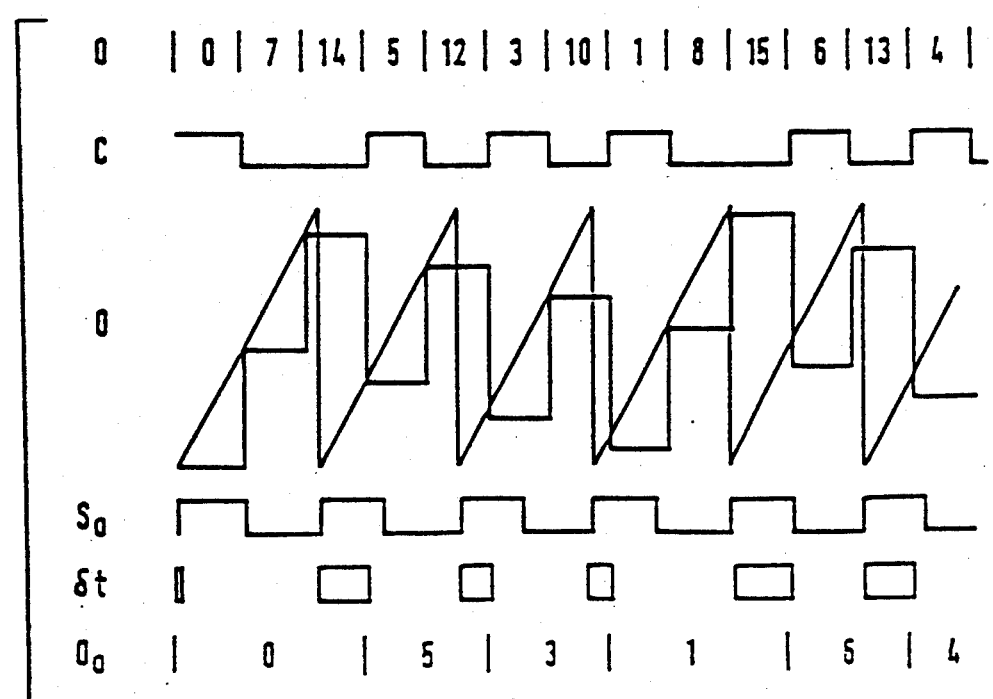

For further explanation of the function of the known digital oscillator according to FIG. 1, reference is now made to the six lines of FIG. 2c. In this case N=7. The carry signal C occurs, each time following an overflow, so that the accumulator content during successive signals has the sequence 0, 5, 3, 1, 6 and 4 so far as is illustrated in this case. In addition to the foregoing numerical representation of the accumulator content O, that content is also shown graphically in the middle portion of FIG. 2c. That graphical representation has superimposed thereon a sawtooth function of the frequency which is the desired frequency $f_0$ of the signal $S_O$ to be generated. The time difference between the rising flanks of the carry signal C and the rising slope of the signal $S_0$ which is to be generated is illustrated just below the signal $S_0$ in the form of more or less wide rectangles of constant height.

In the bottom line FIG. 2c shows the accumulator content $O_o$ established after each overflow for the counted-down signal $S_O$.

In the digital oscillator of the present invention there is a significant correlation which is made plain in FIG. 2c between the accumulator content following an overflow and the time difference $\delta t$. The relation can be expressed as $\delta t = O_o/N$. In many application cases, however, a good approximation is possible by considering $\delta t \approx O_o/8$, which is easily calculated by simply shifting binary digits.

Figure 3:
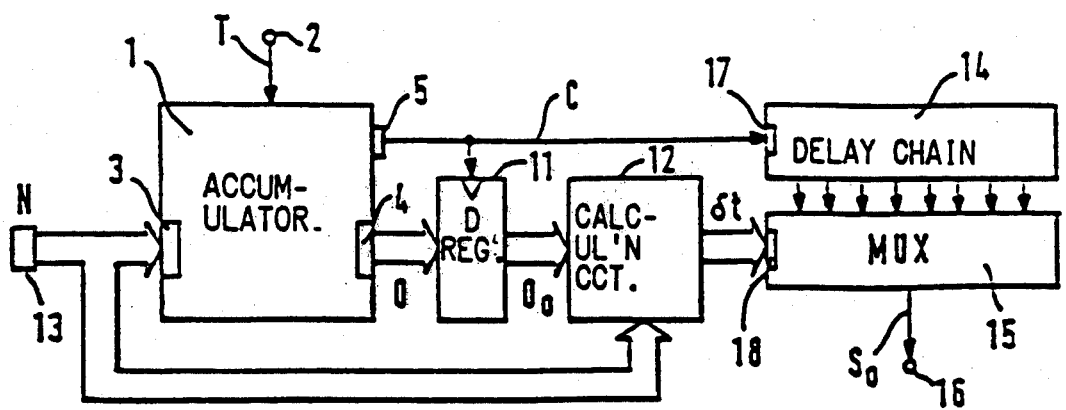
FIG. 3 is a circuit block diagram of a first embodiment of a digital oscillator according to the invention.

The embodiment illustrated in FIG. 3 contains an accumulator 1 with inputs 2, 3 and outputs 4 and 5 as already described in connection with FIG. 1. A calculating circuit 12 is connected to the output 4 through a D register 11. In this case the value N, supplied at an input 13 of the circuit of FIG. 3, is supplied not only to the input 3 of the accumulator, but also to another input of the calculating circuit 12.

The carry output 5 of the accumulator 1 is connected on one hand to the clock input of the D register 11 and on the other hand to the input of a delay chain 14. The delay chain 14 consists of eight elements and the outputs of the several elements are respectively connected to inputs of a multiplexer 15, at the output 16 of which is available the output $S_o$ of the circuit of FIG. 3. The delay chain 14 and the multiplexer 15 constitute a controllable delay device to which signals supplied to the input 17 can be delayed in a manner dependent upon control signals that are supplied at a control input 18.

By means of the D register 11 the accumulator content O is stored from the occurrence of a carry pulse signal C until the next carry pulse. Corresponding to the above derived equation, the value $\delta t$ is calculated from $O_o$ and N in the calculating circuit 12 and is set into the multiplexer 15. In this way the timewise deviation of the carry signal C is compensated every time, so that the signal $S_o$ available at the output 16 is free from jitter.

If the frequency $f_o$ needs to be variable only in a small relative range, the range of variation of N is also reduced, for example $7 \leq N \leq 9$. In this case the calculating circuit 12 can be replaced by a simple limiter circuit 22 which limits $O_o$ to the value range of 0 to 7, as is illustrated among other things in FIG. 4. Either the calculation circuit 2 or the limiter 7 may be regarded as in combination with the D register 11 and the controllable delay device above defined, as means for cyclically delaying the carry signals by a sequence of time intervals respectively calculable from the magnitude of the content of the accumulator during the presence of the carry signal.

Figure 4:
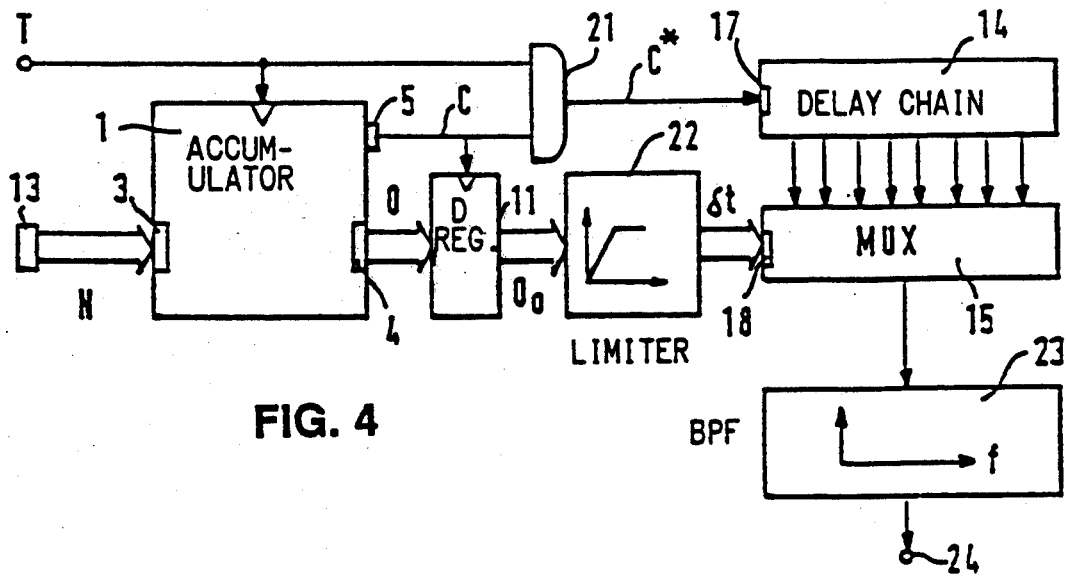
FIG. 4 is a circuit block diagram of a second embodiment of a digital oscillator in accordance with the invention.

Two further developments of the invention are explained with reference to FIG. 4. On the one hand a logic unit, in this case an AND gate 21, is interposed in the carry signal path between the output 5 of the accumulator 1 and the input 17 of the delay chain 14. To the second input of the AND gate 21, the reference frequency pulses T are supplied. Furthermore, a bandpass filter 23 is interposed between the output of the multiplexer 15 and the output terminal of the circuit of FIG. 4.

Figure 5:
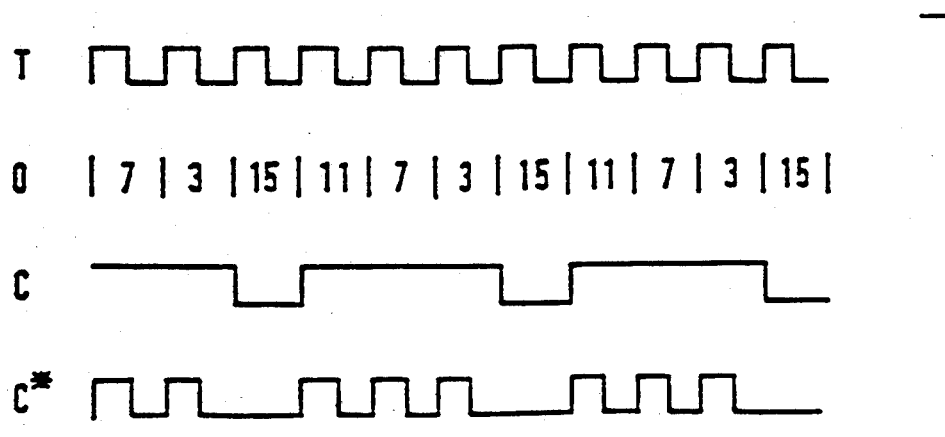
FIG. 5 is a timing diagram for explaining the operation of the second embodiment illustrated in FIG. 4.

The advantages obtainable by the AND gate 21 are illustrated below with reference to a counting example shown in FIG. 5. As in the examples of FIG. 2, an accumulator with four bit places is assumed. In this case the increment N=12 is assumed. This value has the same frequency ratio as in the example of FIG. 3 with the value N=8, namely $f_o = \frac{1}{2} f_R$ because for N>8 the frequency of the carry signal C declines. The maximum carry frequency for a four-bit accumulator is found when N=8.

By interposition of the AND gate 21 (FIG. 4) there is, however, made possible a further raising of the frequency of the signal $S_o$. As illustrated in FIG. 5, for the case of N=12, during three *successive* periods of the reference frequency E the capacity of the accumulator is exceeded, namely during change of the accumulator content O from 15 to 11, from 11 to 7 and from 7 to 3. During all this time the carry signal C has the level H. An AND correlation with the reference frequency T produces a signal C*, of which the average frequency is $\frac{3}{4}$ of the frequency $f_R$ of the reference frequency. For $N \leq 8$ the AND gate produces merely a shortening of the carry signal C. The following equation holds for values of N=0 ... 16 in general for the frequency of the signal C*: $f_o^* = (N/16) \cdot f_R$.

The phase correction of the signal C* takes place in the same way by means of the controllable delay device as in the case of the embodiment illustrated in FIG. 3.

A further extension of the invention additionally makes possible the generation of a signal with a frequency higher than $f_o$. For that purpose a bandpass filter 23 is connected following the multiplexer 15, so that at the output 24 of the filter a signal with a frequency $f_o' = 2 \cdot (N/16) \cdot f_R$ is made available. This signal represents the second harmonic of the signal $S_o$ of the frequency $f_o$. This frequency is easily obtained from the signal $S_o$ with an analog bandpass filter of the second order. Instead of the second harmonic, it is also possible to obtain the third harmonic of the signal $S_o$ with a correspondingly dimensioned bandpass filter.

By use of the bandpass filter of second order, that consists essentially of two resonant circuits, a variation range of frequency $f_o$ of ±1000 ppm, or 0.1%, can be obtained in every case with a simultaneous reduction of adjacent spectrum lines of at least 40 dB.

A four-bit accumulator was assumed in the illustrated content sequence examples for the accumulator, merely for simplification of the explanation. In order to obtain sufficiently quantization, substantially more bit places can be provided. An accumulator satisfactory in that respect can readily be provided as a 16-bit ALU manufactured on a single chip. The further digital operations of the circuit of FIG. 4 can be implemented by a programmable array logic (PAL) circuit integrated on a second chip. These, together with the delay chain and the bandpass filter, then result in only four physical components being needed.

Although the invention has been described with reference to particular illustrative examples, it will be understood that further variations and modifications are possible within the inventive concept.

I claim:

1. A digital oscillator for generating a signal of controllable frequency comprising a source of reference frequency pulses, an accumulator having a timing input connected to said pulse source and connected for being incremented at each pulse from said pulse source by a predetermined number of count unit values and having a count value output and also a carry output for providing carry signals on a predetermined content magnitude being reached by the content of said accumulator, and further comprising circuit means connected for response to said count value and carry outputs of said accumulator for cyclically delaying a sequence of said carry signals respectively by a sequence of time intervals at least approximately equal to a value calculable from the magnitude of the content of the accumulator during the presence of the carry signal and from the maximum count content magnitude thereof.

2. The digital oscillator of claim 1, wherein said connection of said carry output with an input of said controllable delay device passes through a logic unit (21) for logical correlation of said carry signal with pulses of said reference frequency (T).

3. The digital oscillator of claim 1, wherein said count value output (4) of said accumulator is connected to a data input of a register (11) the data content of which is changeable by a signal applied to a timing input of said register, said timing input being connected to said carry output (5) of said accumulator, wherein also a processing device (12, 22) for arithmetically modifying the content of said register is interposed between an output of said register (11) and a control input (18) of said controllable delay device (14, 15), and wherein said circuit means for cyclically delaying a sequence of said carry signals comprises a controllable delay device (14, 15) having an input (17) connected to the carry output (5) of said accumulator (1) and a control input (18) and further comprises a processing device (12, 22) having an input connected to said output of said register (11) and an output connected to said control input (18) of said controllable delay device (14, 15).

4. The digital oscillator of claim 3, wherein an AND gate (21) is interposed between said carry output (5) of said accumulator (1) and an input of said controllable delay device (14, 15) with one input of said AND gate being connected to said carry output (5) of said accumulator (1) and another input of said AND gate being connected to said source of reference pulses, said AND gate (21) having an output connected to said input (17) of said controllable delay device for connection with said carry output of said accumulator, whereby said input (17) of said controllable delay device is indirectly connected to said carry output (5) through said AND gate (21).

5. The digital oscillator of claim 3, wherein at the output of said controllable delay device (14, 15) there is connected a bandpass filter (23), of which the output provides the output of the digital oscillator.

6. The digital oscillator of claim 3, wherein said arithmetic processing device is a magnitude limiting means (22) interposed between said output of said register (11) and said control input (18) of said controllable delay device (14, 15).

7. The digital oscillator of claim 6, wherein at the output of said controllable delay device (14, 15) there is connected a bandpass filter (23), of which the output provides the output of the digital oscillator.

8. The digital oscillator of claim 3, wherein said arithmetic processing device is a calculating means (12) having an input connected to said output of said register (11) and an output connected to said control input (18) of said controllable delay device and wherein means are provided for supplying said predetermined number of unit values both to an incrementation input (3) of said accumulator and also to an additional input of said calculation means (12).

9. The digital oscillator of claim 8, wherein said calculation means (12) are means for selecting a delay magnitude for said controllable delay device according to the formula $\delta t = O_o/N$, where $O_o$ is the accumulator content at the time of the most recent carry signal and N is said predetermined number of unit values.

10. The digital oscillator of claim 8, wherein said calculating means (12) is programmed to calculate a delay to be selected for said controllable delay device according to the formula $\delta t \approx O_o/N^*$, wherein $O_o$ is the accumulator content at the time of the most recent carry signal and $N^*$ is a multiple of 2 equal to, or differing by at most a few units from, said predetermined number of count units (N).

* * * * *